United States Patent
Rosa et al.

(10) Patent No.: US 6,654,155 B2
(45) Date of Patent: Nov. 25, 2003

(54) SINGLE-CRYSTAL-SILICON RIBBON HINGES FOR MICRO-MIRROR AND MEMS ASSEMBLY ON SOI MATERIAL

(75) Inventors: Michel A. Rosa, San Jose, CA (US); Decai Sun, Los Altos, CA (US)

(73) Assignee: Xerox Corporation, Stamford, CT (US)

(*) Notice: Subject to any disclaimer, the term of this patent is extended or adjusted under 35 U.S.C. 154(b) by 0 days.

(21) Appl. No.: 09/724,329

(22) Filed: Nov. 29, 2000

(65) Prior Publication Data

US 2002/0064647 A1 May 30, 2002

(51) Int. Cl.⁷ ............................................. G02B 26/00
(52) U.S. Cl. .................... 359/290; 359/231; 359/223; 359/224; 359/248
(58) Field of Search ............... 359/290, 291, 359/292, 248, 223, 224, 225, 230, 231, 232; 439/492, 87, 31, 852, 856, 496; 174/138 R, 138 C

(56) References Cited

U.S. PATENT DOCUMENTS

| | | |
|---|---|---|
| 5,069,742 A | 12/1991 | Bleil |
| 5,470,797 A | 11/1995 | Mastrangelo |
| 5,490,034 A | 2/1996 | Zavracky et al. |
| 5,629,790 A | 5/1997 | Neukermans et al. |
| 5,677,783 A * | 10/1997 | Bloom et al. ............... 359/224 |
| 5,870,007 A * | 2/1999 | Carr et al. ................... 333/262 |
| 5,903,380 A * | 5/1999 | Motamedi et al. .......... 359/224 |
| 5,962,949 A * | 10/1999 | Dhuler et al. ............... 310/307 |
| 6,046,659 A | 4/2000 | Loo et al. |
| 6,057,520 A | 5/2000 | Goodwin-Johansson |
| 6,074,890 A | 6/2000 | Yao et al. |
| 6,094,289 A | 7/2000 | Moranski et al. |
| 6,153,839 A | 11/2000 | Zavracky et al. |
| 6,229,683 B1 | 5/2001 | Goodwin-Johansson |
| 6,236,491 B1 | 5/2001 | Goodwin-Johansson |
| 6,243,194 B1 * | 6/2001 | Brazas, Jr. et al. ......... 359/290 |
| 6,275,320 B1 | 8/2001 | Dhuler et al. |
| 6,299,462 B1 * | 10/2001 | Biegelsen ..................... 439/81 |
| 6,303,885 B1 | 10/2001 | Hichwa et al. |
| 6,331,257 B1 | 12/2001 | Loo et al. |
| 6,456,420 B1 * | 9/2002 | Goodwin-Johansson .... 359/291 |

FOREIGN PATENT DOCUMENTS

| | | |
|---|---|---|
| EP | 0 502 222 A1 | 9/1992 |
| WO | WO 94/03786 | 2/1994 |

OTHER PUBLICATIONS

European Search Report; Application No. 01127498.2–1524; Apr. 9, 2002; Examiner Michel, A.
Motamedi, M. Edward; *Development of Micro–Electro–Mechanical Optical Scanner*; Society of Photo Optical Instrumentation Engineers, pp. 1346–1353 (May 1997).

(List continued on next page.)

*Primary Examiner*—Georgia Epps
*Assistant Examiner*—Tuyen Tra
(74) *Attorney, Agent, or Firm*—Fay, Sharpe, Fagan, Minnich & McKee, LLP

(57) ABSTRACT

Provided is a micro-electromechanical assembly including an out-of-plane device formed on a device layer of a single crystal silicon substrate. A ribbon structure is formed on the device layer, where the ribbon structure has at least one of a width or depth, which is less than the width or depth of the out-of-plane device. A connection interface provides a connection point between a first end of the out-of-plane device and a first end of a ribbon structure, wherein the ribbon structure and out-of-plane device are integrated as a single piece.

19 Claims, 5 Drawing Sheets

OTHER PUBLICATIONS

Syms, Richard R.A.: "Refractive Collimating Microlens Arrays by Surface Tension Self–Assembly".
IEEE Photonics Technology Letters, IEEE Inc. New York, US, vol. 12, No. 11, Nov. 2000, pp. 1507–1509, XP000981076, ISSN: 1041–1135, *p. 1507, col. 1; figure 2*.

Wibbeler, J. et al.: "Parasitic charging of dielectric surfaces in capacitive microelectromechanical systems (MEMS)".
Sensors and Actuators A, Elsevier Sequoia S.A., Lausanne, CH, vol. 71, No. 1–2, Nov. 1, 1998, pp. 74–80, XP004140077, ISSN: 0924–4247, *p. 76, paragraph 3; figure 2*.

Walker J. F. et al.: "Focused ion beam processing for microscale fabrication".
Microelectronic Engineering, Elsevier Publishers BV., Amsterdam, NL, vol. 30, No. 1, 1996, pp. 517–522, XP004003136, ISSN: 0167–9317 *abstract; figure 2*.

"Communication" from EPO, Apr. 18, 2002, EP Patent No. 01 12 7729.0–2217 of Xerox Corporation and attached European Search Report.

Deborah S. Patterson, Flip Chip Technologies, 3701 E. University Drive, Phoenix, AZ, Seminar, *A Comparison of Popular Flip Chip Bumping Technologies* (Test, Assembly & Packaging Conference (InterPACK '97), in Kona, HW, 1997, pp. 1–10).

* cited by examiner

SINGLE-CRYSTAL-SILICON RIBBON HINGES FOR MICRO-MIRROR AND MEMS ASSEMBLY ON SOI MATERIAL

The U.S. Government has a paid-up license in this invention and the right in limited circumstances to require the patent owner to license others on reasonable terms as provided for by the terms of contract no. 70NANB8H4014 awarded by NIST.

BACKGROUND OF THE INVENTION

The present invention is directed to micro-hinges used in micro-electromechanical systems (MEMS) and micro-systems technology, and more particularly to an improved micro-hinge configuration and design adding robustness and strength to the hinging element.

The use of micro-hinges has become prevalent with the increased utilization and complexity of surface micro-machine components and systems. Typically used in the implementation of out-of-plane or vertically oriented micro-device designs, the micro-hinge is usually fabricated in a minimum two-layer, though typically three-layer, polysilicon process. Such a hinge 10, known as a staple hinge, is illustrated in FIG. 1, integrally connected with micro-mirror 12, and is used to attain out-of-plane motion. The multi-step fabrication process, includes depositing a first layer which is then patterned and etched. Next a second layer is deposited, patterned and etched in such a way that after removing any filling material, the first layer is free to move in a prescribed path, while being held in place by the second layer. This structure creates a rotating joint implemented in MEMS or micro-systems to permit for the mechanical movement required for micro-mirrors and other out-of-plane devices.

Drawbacks to existing micro-hinge designs include process complexity and cost of fabrication.

The inventors have also observed that the device layer of silicon-on-insulator (SIO) wafers are being used to form micro-structures such as mirrors, lenses and other out-of-plane or vertically oriented devices for integrated MEMS and micro-systems. The formation of such devices requires the use of micro-hinges to provide rotational freedom and mechanical support for these out-of-plane devices.

It is therefore considered useful to develop less complex and costly micro-hinges capable of providing the necessary mechanical integrity and strength to allow out-of-plane rotation or vertical movement of SOI device layer structures.

SUMMARY OF THE INVENTION

Provided is a micro-assembly including a micro-device formed on a device layer of a single crystal silicon substrate. A ribbon structure is formed on the device layer, where the ribbon structure is thinned to a thickness which is less than the thickness of the micro-device. A connection interface provides a connection point between a first end of the micro-device and a first end of a ribbon structure, wherein the ribbon structure and micro-device are integrated as a single piece.

DETAILED DESCRIPTION OF PREFERRED EMBODIMENTS

Figure 1:
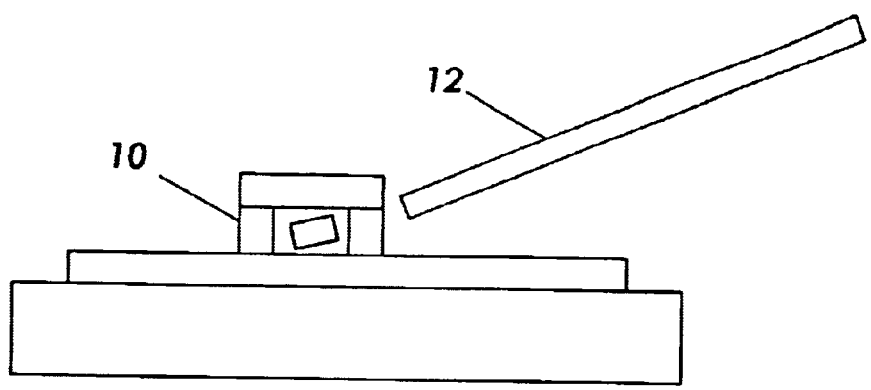
FIG. 1 is directed to a micro-mirrored device using multiple polysilicon layers for implementation of a micro-hinge.
Figure 2:
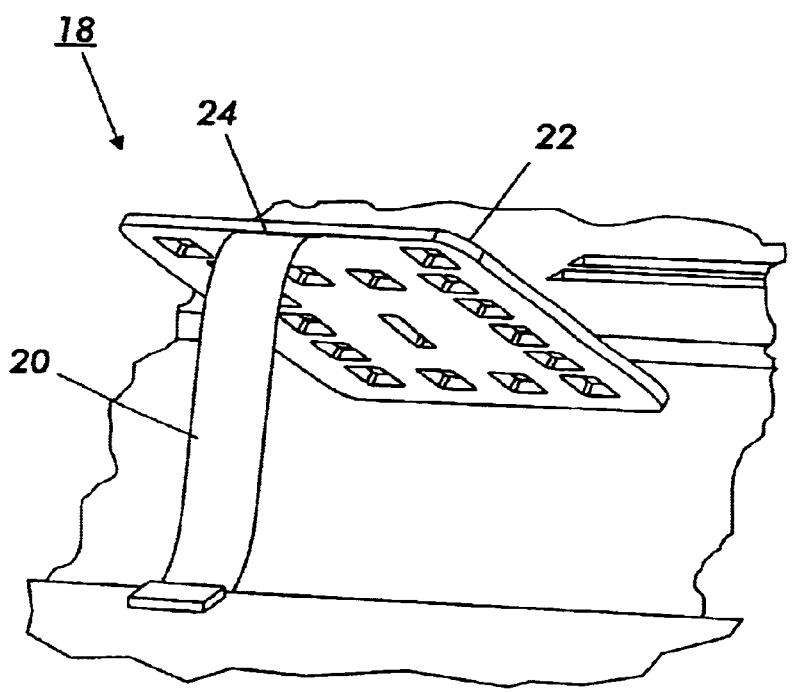
FIG. 2 is an isometric view of a ribbon hinge attached to an out-of-plane device according to the teachings of the present invention.
Figure 3:
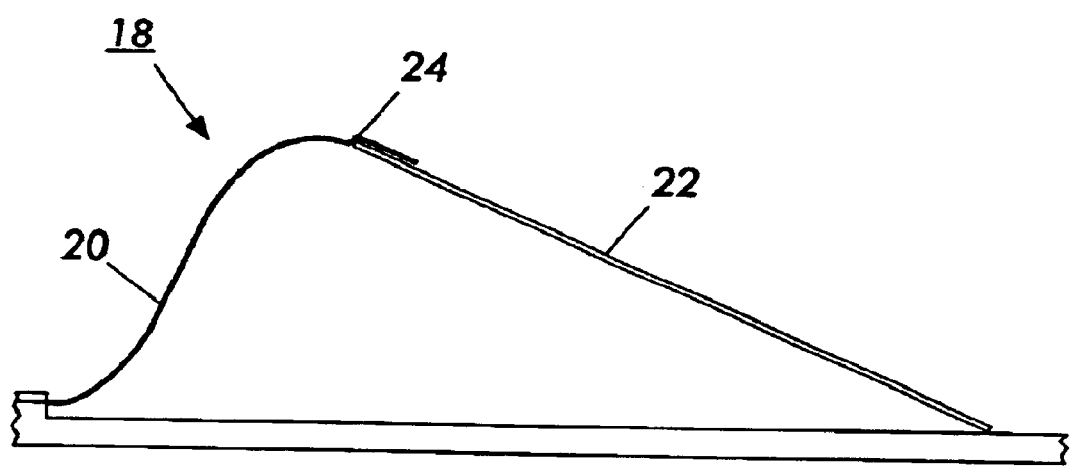
FIG. 3 is a side view of the ribbon hinge and out-of-plane device of FIG. 2.

While FIG. 1 depicts a micro-device implementing a polysilicon staple hinge, FIGS. 2 and 3 illustrate a micro-assembly 18 having a ribbon hinge 20 configured according to the present invention, in an integrated arrangement with a micro-device 22, such as a micro-mirror. The micro-device has been moved from an in-plane position to an angle of approximately 30°. Movement of the micro-device is achievable by a variety of mechanisms, including the use of a micro-probe or an actuator.

Ribbon hinge 20 is, therefore, designed to replace the widely used polysilicon staple-hinge design illustrated in FIG. 1. Ribbon hinge 20 is a single-crystal-silicon (SCS) component which has mechanical stability, and which is configured using a simplified processing procedure. Thus, ribbon hinge 20 of the present invention provides a flexible mechanism as opposed to the jointed staple-hinge of FIG. 1.

Ribbon hinge 20 is formed from the device layer of a silicon-on-insulator wafer, which has been thinned down to allow increased mechanical flexibility. This design produces a high quality mechanical structure having sufficient strength for its intended purpose.

FIGS. 2 and 3 emphasize the flexibility of ribbon hinge 20. In this embodiment, ribbon hinge 20 is approximately 500 nm thick, approximately 50 $\mu$m wide and approximately 140 $\mu$m in length. Micro-device 18, including ribbon hinge 20 and mirror 22 is fabricated using a silicon-on-insulator (SOI) wafer with a device layer thickness of approximately 3 $\mu$m and a buried oxide (BOX) layer thickness of approximately 2 $\mu$m.

In a two-mask process used to manufacture the micro-device 18, an area to be thinned is first lithographically exposed, and surrounding areas are protected, before a timed wet etch reduces the thickness of the exposed silicon area 20 to ~500 nm. Then a subsequent lithography step is used to pattern the hinge 20 and mirror 22 areas exposing all surrounding areas to be etched. This leaves the mirror structure protected, by an oxide layer, and the thin silicon ribbon hinge resting on the sacrificial BOX layer. Following buried oxide removal using a Hydrofluoric Acid (HF) 49% etch process step and subsequent drying procedures, mirror 22 is freed to move.

As will be discussed in greater detail below, the present invention is a two-step process in the sense that in the first step the hinge area 20 is patterned and etched. Then a second procedure is used for lithographically defining and forming the mirror area 22 (or other out-of-plane or vertically oriented device). It is of course possible to inverse these processes by processing the out-of-plane device area first, then thinning the ribbon layer. An issue in this regard is that the out-of-plane device and ribbon hinge are all formed from the same material layer. The difference between the ribbon hinge and the out-of-plane device is the geometry of the patterning, and the physical thickness of the areas. Particularly, etching ribbon hinge 20 to a much thinner cross-section than the out-of-plane device, permits increased flexibility of the ribbon hinge. The flexibility of ribbon hinge 20 is illustrated by its almost S-shape (See FIG. 3).

The methodology that incorporates fabrication of the ribbon hinge structure in the same material as the out-of-plane device such as the mirror, has many advantages over existing hinge technologies, including a simplified fabrication process. For example, since the hinge is fabricated using the same material layer as that of the out-of-plane device, there is no adhesive joint or holding structure necessary between the hinge and the attached device. Such a design accommodates the high mechanical torque and forces delivered by the attached mechanical device without comprising the integrity of connection point 24 between the hinge structure and the attached micro-device.

Figure 4:
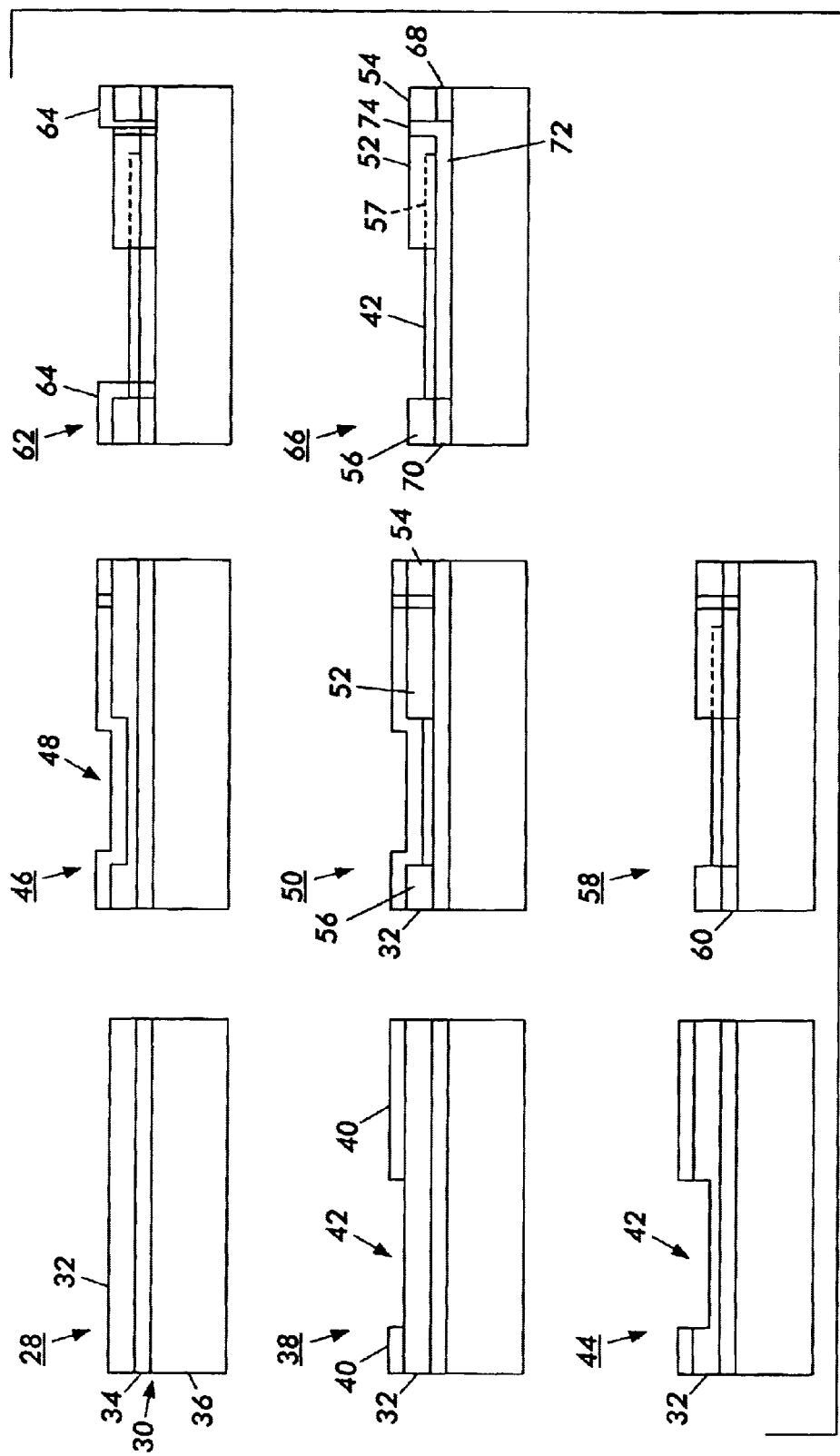
FIG. 4 sets forth the processing steps for formation of the ribbon structure attached to an out-of-plane device in accordance with the teachings of the present invention.

FIG. 4 illustrates a process flow for fabrication of a single crystal silicon ribbon hinge according to the present invention. In step 28, the process begins with a clean silicon-on-insulator (SOI) wafer 30 having a single crystal silicon device layer 32, a buried oxide layer 34, and a substrate layer 36. In a first step of the process, 38, a photo-resist layer 40 is deposited on device layer 32 using standard lithographic processes. Photo-resist layer 40 is patterned in such a way as to expose the area to be thinned into the ribbon hinge 42. In a next step 44, a wet etching process is undertaken such as wet etching with a potassium-hydroxide (KOH) 45% solution at 60° C. The wet etching causes the exposed ribbon hinge area 42 of device layer 32 to be removed to a thickness of approximately 500 nm.

In step 46, previously applied resist layer 40 is removed prior to a repatterning for etching of the out-of-plane device, an island area and an anchor structure. Following removal of first photo-resist layer 40, second resist layer 48 is applied on the top surface of SOI 30. In step 50, a dry etching process is undertaken on the exposed silicon of device layer 32 to form the out-of-plane device structure 52 as well as the island area 54 and anchor structure 56. In step 58, the second layer of photo-resist 48 has been removed, and an etching process is started to begin etching the exposed buried oxide layer 60, using a Hydrofluoric Acid (HF) 49% solution.

Next, in step 62, the third and final layer of photo-resist 64 is deposited and patterned on the SOI wafer 30. This final photo-resist layer 64 is to be used during the buried oxide-release (BOX) operation, wherein the out-of-plane device 52 is released by etching all unprotected buried oxide. This process is shown completed in step 66 where remaining buried oxide layer material 68 and 70 are located under the island structure 54 and under the anchor section 56. As can be seen in step 66, a separation layer 72 and separation edge 74 are shown as being void of material. Removal of the material in these areas allows for the movement of the out-of-plane device 52 and ribbon hinge 42 in a manner similar to that shown in FIGS. 2 and 3. In step 66, it is noted that all remaining photo-resist is removed, for example by a dry $O_2$ plasma-etch process. Thus, step 66 depicts the original SOI wafer 30 as a completed mirror and hinge structure.

Figure 5:
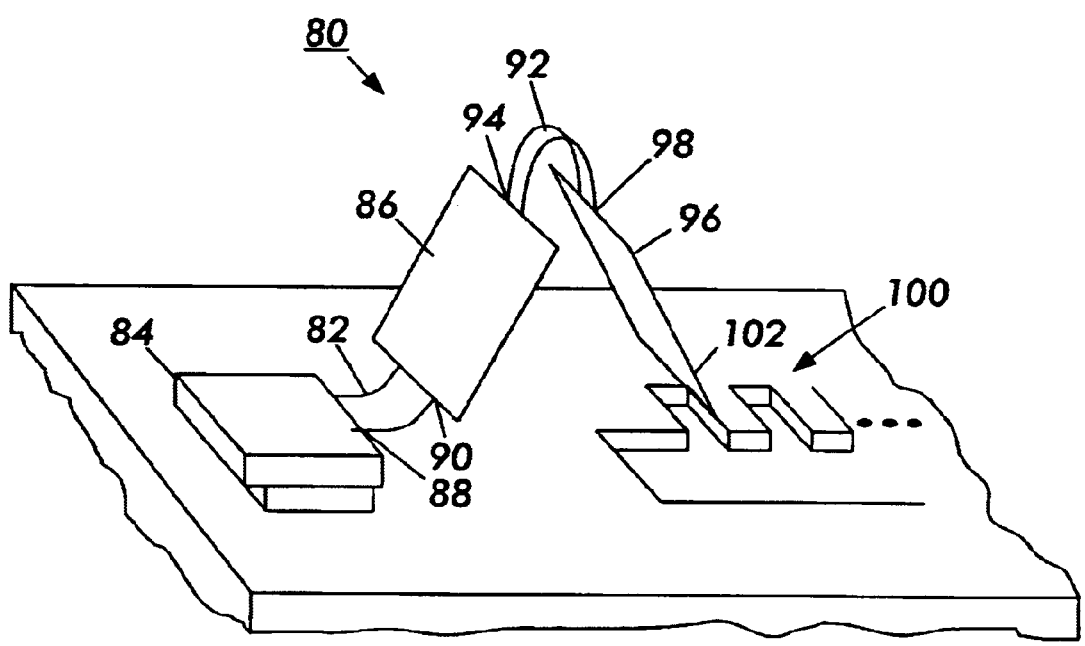
FIG. 5 is an illustration for one design in accordance with the teachings of the present invention.

Turning to FIG. 5, set forth is an implementation of a passive micro-mirror assembly using the ribbon-hinge methodology of the present invention. Dual mirror device 80 illustrates that by application of the discussed manufacturing steps a SOI wafer can be processed into a micro-device incorporating multiple mirrors and hinges. A first ribbon hinge 82 is fabricated so as to be integrated to an anchor portion 84 at one end and to a movable mirror structure 86 at a second end. First, ribbon hinge 82 and anchor portion 84 are joined at connection point 88, and first ribbon hinge 82 and mirror 86 are joined at connection point 90. Thereafter, a second ribbon hinge 92 is connectably fabricated to mirror 86 at connection point 94 and further integrated to second mirror 96 at connection point 98. The mirrors and ribbon hinges of device 80 are fabricated in the same device layer of an SOI wafer.

Slots 100 may be formed in the same device layer as ribbon hinges 88, 92 and mirrors 86, 96. Slots 100 are formed in an area behind the mirrors outside of the area of the ribbon hinges, and are made to run along both sides of mirror 96 (only one side of slots 100 are shown for convenience) allowing balanced fixture of mirrors 86, 96. In such a passive design, mirrors 86, 96 are assembled using micro-probes, and once in place reside fixed and unaided. Particularly, as micro-probe (not shown) moves mirror 96 out of plane, the side edges 102 of mirror 96 may be placed into any one of slots of slot configuration 100.

Once placed within a slot, mirror 96 as well as mirror 86 is maintained in a fixed position. It is noted that the flexibility of the ribbon hinges 82 and 92 allow for flexing in opposite directions. For example, ribbon hinge 82 is shown flexed in a concave position whereas ribbon 92 is in a convex position.

Figure 6:
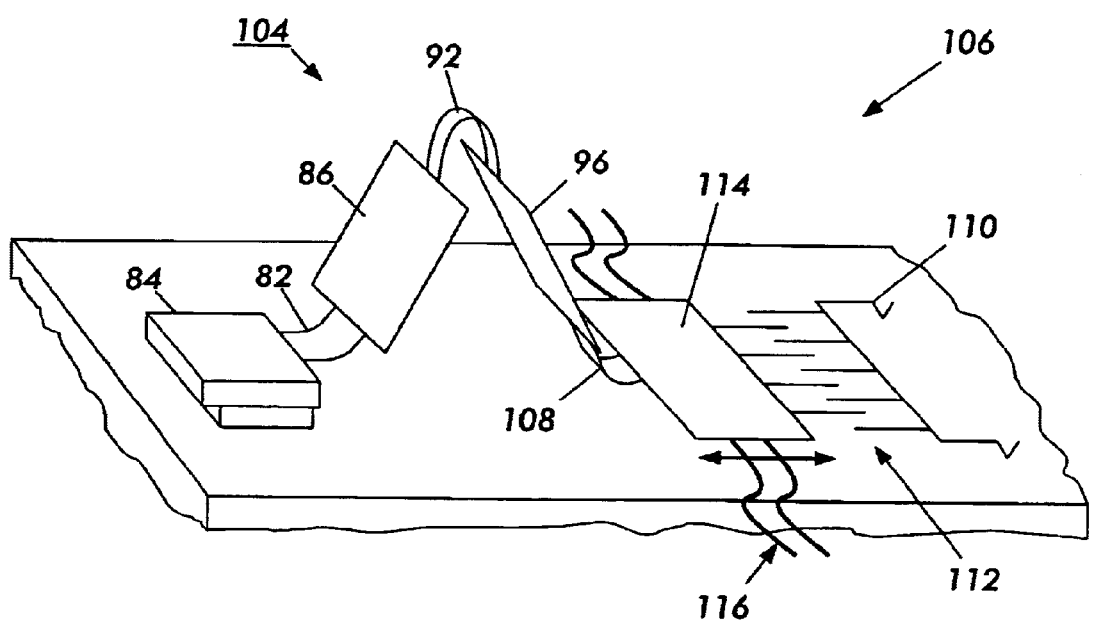
FIG. 6 illustrates an alternative embodiment of the present invention wherein the movement of the micro-mirrors is accomplished by an active operation.

FIG. 6 sets forth an alternative micro-structure 104 embodiment implementing ribbon hinges according to the present invention. Particularly, the movement of mirrors is obtained via active operation as opposed to passive, e.g. movement of the mirrors by a probe. A controllable element, such as a comb-drive actuator assembly 106 is attached to mirror 96 via ribbon hinge 108. Comb-drive assembly 106 includes interdigitated comb fingers 112, a drive shuttle 114, and suspension arms 116. The mirror angles are then dynamically adjusted by application of an applied voltage from a voltage source (not shown) which results in the displacement of the comb-drive assembly 106 and hence the attached devices. It is to be appreciated other active actuators may also be used to move out-of-plane devices in accordance with the present invention.

While the present invention is described with respect to a preferred embodiment, it would be apparent to one skilled in the art to practice the present invention into other configurations and designs. Such alternate embodiments would not cause departure from the spirit and scope of the present invention.

Having thus described the preferred embodiments, what is claimed is:

1. A micro-electromechanical assembly comprising:
an out-of-plane device formed in a single-crystal-silicon device layer of a silicon-on-insulator substrate and;
a flexible ribbon structure formed in the device layer, wherein the out-of-plane device and ribbon structure are both single-crystal-silicon single layer components from the same single-crystal-silicon device layer formed as an integrated assembly, and the ribbon structure has a thickness of between approximately 400 nm to 600 nm, a width of between approximately 25 $\mu$m to 75 $\mu$m, and a length of between approximately 70 $\mu$m to 210 $\mu$m.

2. The invention according to claim 1 wherein the device layer is formed as part of a silicon-on-insulator wafer, including at least the device layer and a buried oxide layer.

3. The invention according to claim 2 wherein the out-of-plane device is fabricated from a silicon-on-insulator wafer has an initial uniform device layer thickness.

4. The invention according to claim 2 wherein a first end of the ribbon structure is attached to an anchor point above the buried oxide layer, and a second end of the out-of-plane device is unattached to the buried oxide layer.

5. The invention according to claim 1 wherein the ribbon structure has at least one of a width or thickness which is less than at least one of a width or thickness of the out-of-place device.

6. The invention according to claim 1 wherein the out-of-plane device is a micro-mirror.

7. The invention according to claim 1 wherein the ribbon is a micro-hinge.

8. A micro-electromechanical assembly comprising:

an out-of-plane device formed in a single-crystal-silicon device layer of a silicon-on insulator substrate and;

a flexible ribbon structure formed in the device layer, wherein the out-of-plane device and ribbon structure are formed as an integrated assembly, and the ribbon is configured with a mechanical integrity which permits application of a side-twisting mechanical torque to the out-of-plane device sufficient to twist the out-of-plane device to 90° or more from an initial 0° twisted position.

9. The invention according to claim 8 wherein the device layer is formed as part of a silicon-on-insulator wafer, including at least the device layer and a buried oxide layer.

10. The invention according to claim 9 wherein a first end of the ribbon structure is attached to an anchor point above the buried oxide layer, and a second end of the out-of-plane device is unattached to the buried oxide layer.

11. The invention according to claim 8 wherein the ribbon structure has a thickness of between approximately 400 nm to 600 nm, a width of between 25 $\mu$m–75 $\mu$m, and a length of between 70 $\mu$m and 210 $\mu$m.

12. The invention according to claim 8 wherein the out-of-plane device is a micro-mirror.

13. The invention according to claim 8 wherein the ribbon is a micro-hinge.

14. A micro-electromechanical assembly comprising:

an out-of-plane device formed in a single-crystal-silicon device layer of a silicon-on-insulator substrate and;

a flexible ribbon structure formed in the device layer, wherein the out-of-plane device and ribbon structure are formed as an integrated assembly, and wherein the ribbon is configured with a mechanical integrity which permits application of a lifting out-of-plane mechanical torque to lift the out-of-plane device from 0° which is in the horizontal plane, to 90° or more out of the horizontal plane.

15. The invention according to claim 14 wherein the device layer is formed as part of a silicon-on-insulator wafer, including at least the device layer and a buried oxide layer.

16. The invention according to claim 15 wherein a first end of the ribbon structure is attached to an anchor point above the buried oxide layer, and a second end of the out-of-plane device is unattached to the buried oxide layer.

17. The invention according to claim 14 wherein the ribbon structure has a thickness of between approximately 400 nm to 600 nm, a width of approximately between 25 $\mu$m to 75 $\mu$m, and a length of between approximately 70 $\mu$m to 210 $\mu$m.

18. The invention according to claim 14 wherein the out-of-plane device is a micro-mirror.

19. The invention according to claim 14 wherein the ribbon is a micro-hinge.

* * * * *